(12) United States Patent
Testa et al.

(10) Patent No.: US 12,470,180 B2
(45) Date of Patent: Nov. 11, 2025

(54) COMMON-GATE AMPLIFIER CIRCUIT (71) Applicant: GLOBALFOUNDRIES U.S. Inc., Malta, NY (US)

(72) Inventors: Paolo Valerio Testa, Madrid (ES); Shafiullah Syed, Murphy, TX (US)

(73) Assignee: GLOBALFOUNDRIES U.S. Inc., Malta, NY (US)

( * ) Notice: Subject to any disclaimer, the term of this patent is extended or adjusted under 35 U.S.C. 154(b) by 712 days.

(21) Appl. No.: 17/864,733

(22) Filed: Jul. 14, 2022

(65) Prior Publication Data
US 2024/0022219 A1 Jan. 18, 2024

(51) Int. Cl.
*H03F 3/193* (2006.01)
*H10D 1/66* (2025.01)

(52) U.S. Cl.
CPC .............. *H03F 3/193* (2013.01); *H10D 1/66* (2025.01); *H03F 2200/451* (2013.01); *H03F 2200/72* (2013.01)

(58) Field of Classification Search
CPC ... H10D 1/66; H10D 1/62; H10D 1/68; H01L 23/5223; H01L 23/5226; H03F 2200/72
See application file for complete search history.

(56) References Cited

U.S. PATENT DOCUMENTS

| 6,146,939 | A | 11/2000 | Dasgupta | |
|---|---|---|---|---|
| 9,813,024 | B2 | 11/2017 | Kumar | |
| 2006/0034133 | A1 | 2/2006 | Sekiguchi et al. | |
| 2007/0075341 | A1* | 4/2007 | Pan | H10D 84/212 257/E29.345 |
| 2007/0241422 | A1* | 10/2007 | Chen | H10D 89/60 257/528 |
| 2015/0340997 | A1 | 11/2015 | Kato et al. | |
| 2020/0162041 | A1* | 5/2020 | Liang | H03F 3/211 |
| 2021/0375747 | A1* | 12/2021 | Manchana | H10D 62/107 |

OTHER PUBLICATIONS

Paolo Valerio Testa et al., "Layout considerations for common-base amplifiers operating at 200 GHz", https://ieeexplore.ieee.org/document/7974141, 2017 13th Conference on Ph.D. Research in Microelectronics and Electronics (Prime), 2017, pp. 197-200, doi: 10.1109/PRIME.2017.7974141, Abstract, 3 pages.

(Continued)

*Primary Examiner* — Davienne N Monbleau
*Assistant Examiner* — Emily Farmer
(74) *Attorney, Agent, or Firm* — David Cain; Andrew M. Calderon; Calderon Safran & Wright P.C.

(57) ABSTRACT

The present disclosure relates to semiconductor structures and, more particularly, to a common-gate amplifier circuit and methods of operation. The structure includes at least one well in a substrate, a first metal layer connected to a gate of a transistor circuit, a second metal layer overlapped over the first metal layer to form a capacitor, and a third metal layer connected with vias to the first metal layer and overlapped with the second metal layer to form a second capacitor. At least one capacitance in at least one of a junction between the at least one well and the substrate and between overlapped metal layers of the first metal layer, the second metal layer, and the third metal layer.

18 Claims, 8 Drawing Sheets

(56) References Cited

OTHER PUBLICATIONS

Robert L. Schmid et al., "Best practices to ensure the stability of sige HBT cascode low noise amplifiers", 2012 IEEE Bipolar/BiCMOS Circuits and Technology Meeting (BCTM), 2012, pp. 1-4, doi: 10.1109/BCTM.2012.6352657, Abstract, 3 pages.
Chi Zhang et al., "A Low Noise Figure 28GHz LNA in 22nm FDSOI Technology", 2019 IEEE Radio Frequency Integrated Circuits Symposium (RFIC), 2019, pp. 207-210, doi: 10.1109/RFIC.2019.8701831, Abstract, 3 pages.
Yang Chang et al., "A V-Band Power Amplifier With 23.7-dBm Output Power, 22.1% PAE, and 29.7-dB Gain in 65-nm CMOS Technology", IEEE Transactions on Microwave Theory and Techniques, vol. 67, No. 11, pp. 4418-4426, Nov. 2019, doi: 10.1109/TMTT.2019.2939527, Abstract, 3 pages.
Yanfei Mao et al., "A 245 GHz CB LNA in SiGe", 2011 6th European Microwave Integrated Circuit Conference, 2011, pp. 224-227, Abstract, 3 pages.
Taiwanese Notice of Allowance allowed on Jan. 8, 2025 in TW Application No. 112122125, with English Translation, 4 pages.
EP Search Report in EP Application No. 23179101.3-1212 dated Dec. 1, 2023, 14 pages.
Taiwanese Office Action issued May 14, 2024 in TW Application No. 112122125, with Google English Translation, 18 pages.
Korean Office Action issued Dec. 13, 2024 in KR Application No. 10-2023-0068130, with Google English Translation, 16 pages.

\* cited by examiner

COMMON-GATE AMPLIFIER CIRCUIT

BACKGROUND

The present disclosure relates to semiconductor structures and, more particularly, to a common-gate amplifier circuit and methods of manufacture and operation.

A gate of a common-gate amplifier circuit requires a very reliable alternating current (AC) ground for peak amplifier performance in a linear operation (gain and maximum frequency) and a non-liner operation (power added efficiency and output power). Further, due to layout parasitics, an optimal grounding of the gate of the common-gate amplifier circuit is difficult to achieve at a high frequency of operation (e.g., millimeter-wave frequencies).

In conventional amplifier circuits, a capacitor may be placed in near proximity to a gate of the amplifier circuit to ensure AC ground. However, in this situation, there is still interconnection parasitic from a gate of the common-gate amplifier circuit to the capacitor itself. In this situation, parasitic inductance can be approximately 5 picohenry (pH) and resistance can be approximately 5 ohms, which reduces the maximum frequency of the amplifier circuit by more than 35 gigahertz (GHz) at millimeter-wave frequency of operation for modern integrated circuit semiconductor technologies.

SUMMARY

In an aspect of the disclosure, a structure comprises: at least one well in a substrate; a first metal layer connected to a gate of a transistor circuit; a second metal layer overlapped over the first metal layer to form a first capacitor; a third metal layer connected with vias to the first metal layer and overlapped with the second metal layer to form a second capacitor. At least one capacitance is in at least one of a junction between the at least one well and the substrate and between overlapped metal layers of the first metal layer, the second metal layer, and the third metal layer.

In an aspect of the disclosure, a circuit comprises: a transistor including a gate over at least one N-well in a substrate, a first metal layer connected to the gate; a second metal layer overlapped over the first metal layer to form a first capacitor; and a third metal layer connected to the first metal layer through vias and overlapped with the second metal layer to form a second capacitor. At least one capacitance is at a junction between the at least one N-well and the substrate. The first metal layer, the second metal layer, and the third metal layer are vertically stacked above each other and directly over the gate.

In an aspect of the disclosure, a method comprises: forming at least one well in a substrate; forming a transistor circuit on the at least one well; forming a first metal layer over a gate of the transistor circuit; forming a second metal layer over the first metal layer; forming a third metal layer over the second metal layer. The second metal layer is connected to the substrate through a via, the third metal layer is connected to the first metal layer through a second via, and at least one capacitance is at least one of a junction between the at least one well and the substrate and between overlapped metal layers of the first metal layer, the second metal layer, and the third metal layer.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to semiconductor structures and, more particularly, to a common-gate amplifier circuit and methods of manufacture and operation. Advantageously, the common-gate amplifier circuit improves stability, increases maximum frequency, and improves large signal performance by AC grounding the gate of the transistor. The 3D transistor structure of the present disclosure saves area and reduces parasitic inductance by using a capacitance of a junction between the well where the transistor is implemented and the substrate where the well is embedded. The junction capacitance realizes the AC grounding of the gate of the transistor structure by connecting the gate to the well and the substrate to AC ground. On top of the 3D transistor structure, the present disclosure further saves area and reduces parasitic inductance by using by using a Metal-Oxide-Metal (MOM) distributed capacitor overlapped on the 3D transistor structure.

In more specific embodiments, the present disclosure saves area by eliminating the need of an external capacitor connected to the transistor gate to implement the AC-grounding function. The present disclosure reduces the parasitic inductance and resistance by eliminating the need of wiring between an external capacitor connected to the transistor gate as the capacitance necessary to realize the AC grounding of the gate is realized in the same area of the transistor device.

The common-gate amplifier circuit can also be used in different types of applications, such as power amplifiers, a low-dropout (LDO) regulator, a low noise amplifier (LNA), a current mirror, a bandgap voltage reference circuit, amongst other electronic devices. Power amplifiers (e.g., millimeter-wave circuits) may make use of several transistors connected in parallel to increase a total device width. For example, in a non-limiting embodiment, 16 transistors with device width of approximately 19 um can be used for a power amplifier to achieve a total device width of approximately 304 um (see, e.g., FIGS. 2A-2D).

In more specific embodiments, a structure comprises: at least one well in a substrate; a first metal layer connected to a gate of a transistor circuit; a second metal layer overlapped to the first metal layer to form a first capacitor; and a third metal layer connected to the first metal layer with vias and overlapped to the second metal layer to form a second capacitance. At least one capacitance is at a junction between the at least one well and the substrate. The second metal layer and the substrate are at AC ground potential. The well and the gate are equipotential. The first metal layer, the second metal layer, and the third metal layer are vertically stacked above each other and directly over the gate. In further embodiments, a structure comprises: a transistor including a gate over at least one well in a substrate, a first metal layer connected to the gate; a second metal layer overlapped to the first metal layer to form a first capacitor; and a third metal layer connected to the first metal layer with vias and overlapped to the second metal layer to form a second capacitance. At least one capacitance is at a junction between the at least one well and the substrate. The second metal layer and the substrate are at AC ground potential. The well and the gate are equipotential. The first metal layer, the second metal layer, and the third metal layer are vertically stacked above each other and directly over the gate.

The common-gate amplifier circuit of the present disclosure may be manufactured in several ways using a number of different tools. In general, though, the methodologies and tools are used to form structures with dimensions in the micrometer and nanometer scale. The methodologies, i.e., technologies, employed to manufacture the common-gate amplifier circuit of the present disclosure have been adopted from integrated circuit (IC) technology. For example, the structures are built on wafers and are realized in films of material patterned by photolithographic processes on the top of a wafer. In particular, the fabrication of the photonic chip security structure uses three basic building blocks: (i) deposition of thin films of material on a substrate, (ii) applying a patterned mask on top of the films by photolithographic imaging, and (iii) etching the films selectively to the mask.

Figure 1A:
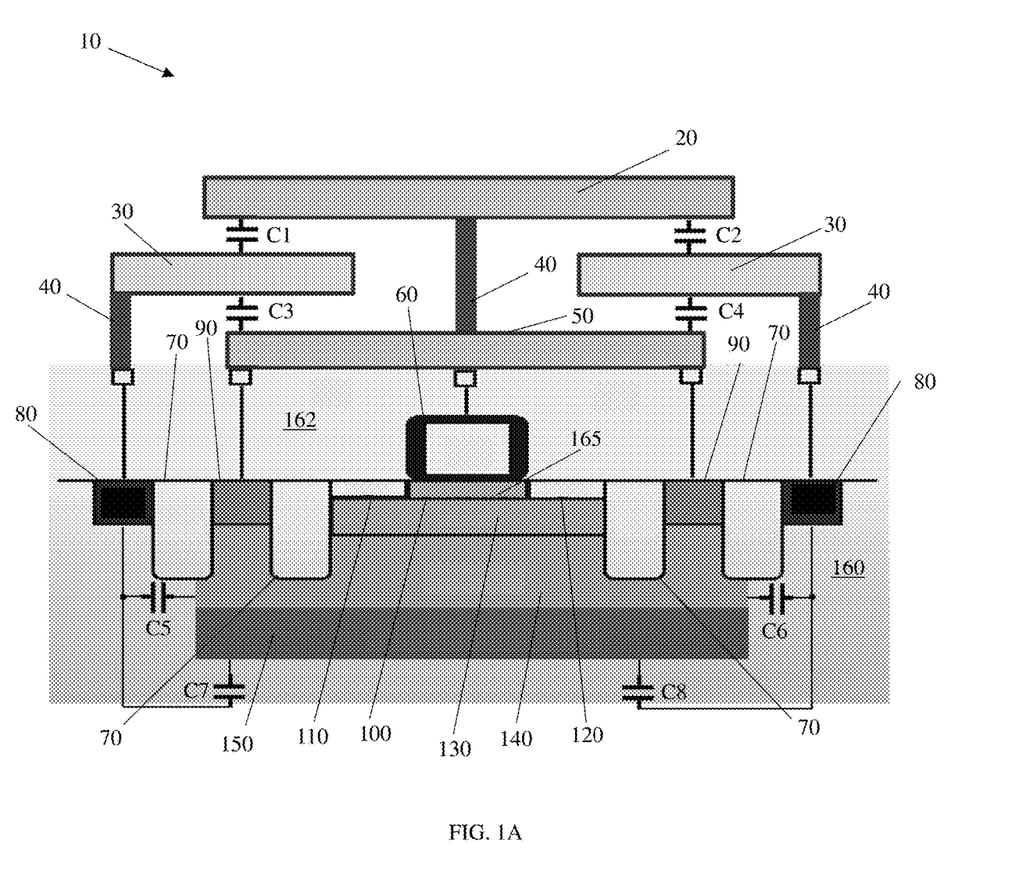
FIGS. 1A-1B show a N-type transistor circuit structure in accordance with aspects of the present disclosure.
Figure 1B:
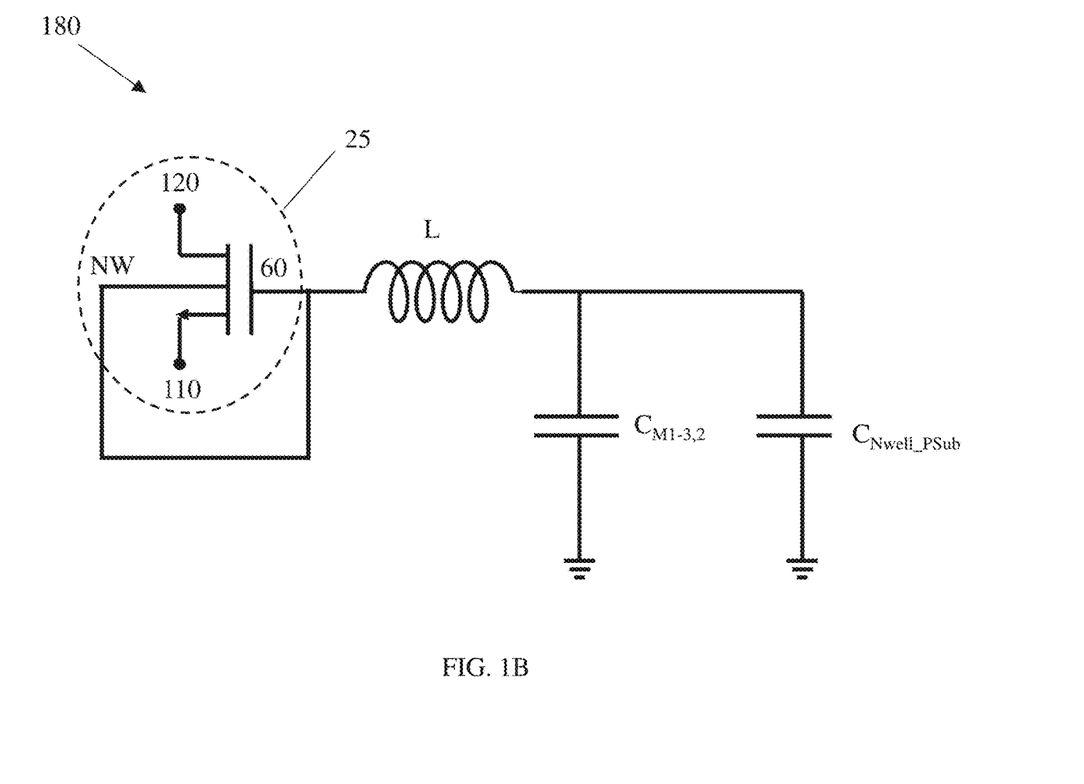

FIGS. 1A-1B show a N-type transistor circuit structure in accordance with aspects of the present disclosure. The present disclosure applies to a P-type device by adjusting a polarity of semiconductor materials. In embodiments, the transistor circuit structure 10 includes a substrate 160 (i.e., a handle wafer), insulator layer 130 and a semiconductor material 165 on the insulator layer 130. In embodiments, the handle wafer 160 and the semiconductor material 165 may be N-type semiconductor material and, preferably the semiconductor material 165 may be semiconductor-on-insulator (SOI) technology. In embodiments, the semiconductor material 165 can be a fully depleted semiconductor-on-insulator (FDSOI) substrate; although other embodiments may be bulk substrate. In embodiments, the handle wafer 160 and semiconductor material 165 may be composed of any suitable material including, but not limited to, Si, SiGe, SiGeC, SiC, GaAs, InAs, InP, and other III/V or II/VI compound semiconductors. The insulator layer 130 may be any insulator material and, preferably, a buried oxide material.

A deep N-well 150 may be provided in the handle wafer 160, with an N-well 140 in the deep N-well 150. The buried oxide (BOX) layer 130 may be on top of the N-well 140. A gate structure 60 may be provided over a channel region 100 in the semiconductor material 165. The channel region 100 may be between a source region 110 and a drain region 120. Shallow trench isolation (STI) structures 70 may also extend into the handle wafer 160, which isolate the gate structure 60, in addition to doped regions 80, 90. For example, N+ regions 90 may be between the STI structures 70, separated from the P+ regions 80. The P+ regions 80 may also be within the handle wafer 160 and are connected to vias 40 within a dielectric material 162.

In embodiments, the STI structures 70 can be formed by conventional lithography, etching and deposition methods known to those of skill in the art. For example, a resist formed over the handle wafer 160 is exposed to energy (light) to form a pattern (opening). An etching process with a selective chemistry, e.g., reactive ion etching (RIE), will be used to transfer the pattern from the resist layer to the handle wafer 160 to form one or more trenches through the openings of the resist. Following the resist removal by a conventional oxygen ashing process or other known stripants, insulator material can be deposited by any conventional deposition processes, e.g., chemical vapor deposition (CVD) processes. Any residual material on the surface of the handle wafer 160 can be removed by conventional chemical mechanical polishing (CMP) processes.

The wells 140, 150 and doped regions 80, 90 may be formed by conventional ion implantation processes. For example, the wells 140, 150 and doped regions 80, 90 may be formed by introducing a concentration of a different dopant of opposite conductivity type in the handle wafer 160. In embodiments, respective patterned implantation masks may be used to define selected areas exposed for the implantations. The implantation masks may include a layer of a light-sensitive material, such as an organic photoresist, applied by a spin coating process, pre-baked, exposed to light projected through a photomask, baked after exposure, and developed with a chemical developer. Each of the implantation masks has a thickness and stopping power sufficient to block masked areas against receiving a dose of the implanted ions. The doped region 80 may be doped with p-type dopants, e.g., Boron (B), and the N-wells 140, 150 and N+ region 90 may be doped with n-type dopants, e.g., Arsenic (As), Phosphorus (P) and Sb, among other suitable examples. The source region 110 and drain region 120 may also be formed by an ion implantation process or an epitaxial growth process with an in-situ dopant.

Although not critical to the understanding of the present disclosure, the gate structure 60 may be fabricated using conventional CMOS processes. For example, the gate structure 60 can be fabricated using standard CMOS or replacement gate processes using. In the standard CMOS processing, a gate dielectric and polysilicon are formed, e.g., deposited, onto the substrate material, followed a patterning process. An insulator material such as nitride or oxide can be deposited on the patterned materials, followed by an anisotropic etching process to form sidewalls.

In embodiments, a junction between the N-wells 140, 150 and the handle wafer 160 may have a parasitic capacitance, e.g., as represented by C5, C6, C7, C8, used in this disclosure to eliminate the need of an external capacitor to AC ground the transistor gate. As the N+ regions 90 have a higher bias than the P+ regions 80, a reverse bias condition of the parasitic capacitance C5, C6, C7, and C8 occurs at the junction between the N-wells 140, 150 and the handle wafer 160. In embodiments, the parasitic capacitance C5, C6, C7, C8 may be eliminated in bulk substrate technologies where the transistor device is implemented directly in the wafer handle 160.

In FIG. 1A, a first metal (M1) layer 50 is to be connected to the gate structure 60 or to the N+ regions 90, or to both. The M1 layer 50 is to be overlapped to the second metal (M2) layer 30 through to form the capacitors C3 and C4. The M1 layer 50 may be connected to the third metal (M3) layer 20 through the via 40. The M1 layer 50 may also have a gate terminal CG with a parasitic inductance $L_p$ as a result of being connected to a back gate N-well terminal NW (see, e.g., FIG. 1B). In embodiments, the inductance $L_p$ may have a value less than 1 picohenry (pH); although embodiments are not limited.

The second metal (M2) layer 30 is to be connected to AC ground to realize a ground plane which overlaps the M1 layer 50. The M2 layer 30 may be connected to the P+ regions 80 through vias 40 to be equipotential to the wafer handle 160. The M2 layer may overlap the M3 layer 20 through to form the capacitors C1 and C2. The M3 layer may also have the gate terminal CG with the inductance $L_p$ as the result of being connected to the back gate N-well terminal NW.

Therefore, the M1 layer 50 and the M3 layer 20 may have the inductance $L_p$ as a result of a gate terminal being connected to a (back-gate) well terminal of the transistor circuit. In a non-limiting embodiment, the accumulation of the capacitors C3 and C4 between the gate terminal CG of the M1 layer 50 and the AC ground GND supported by the M2 layer 30 can be an approximate value of 50 fF for modern semiconductor integrated circuit technologies and a transistor width of 19 um. The metal layers M1, M2, M3 may be formed by either a conventional additive or substrative process as is known in the art such that no further explanation is required for a complete understanding of the present disclosure.

In FIG. 1A, the M1 layer 50, the M2 layer 30, and the M3 layer 20 are stacked vertically above each other and directly over the gate 60. In this way, considerable area savings can be achieved as the capacitor required to AC ground the transistor gate is realized in the same area of the transistor device. This is in contrast to known circuits, where the capacitor necessary to AC ground the transistor gate is realized on a side of the transistor structure, and the M1 layer extends to a side of a transistor structure to connect gate and capacitor. A M2 layer may be above the M1 layer and extends to a side of the structure, with higher metal layers (i.e., M3+ layers) over the M2 layer stacked away from the gate structure.

FIG. 1B shows a circuit schematic 180 of the transistor circuit structure 10 of FIG. 1A. In the circuit schematic 180, a transistor 25 includes the gate structure 60, the drain 120, the source 110, and the back gate N-well terminal NW. The gate structure 60 may be connected to the inductor L with the inductance value of $L_p$. The inductor L represents the parasitic inductance of the connection between gate and well to the capacitances $C_{M1-3,2}$ and $C_{Nwell\_PSub}$. The approximated capacitor $C_{M1-3,2}$ represents the accumulated capacitance of C1, C2, C3, and C4 (e.g., the capacitance between the M1 layer 50, the M2 layer 30, and the M3 layer 20 in FIG. 1A). The approximated capacitance $C_{Nwell\_Psub}$ represents the accumulated capacitance of C5, C6, C7, and C8 (e.g., the capacitance at a junction between the N-wells 140, 150 and the handle wafer 160).

In FIGS. 1A-1B, by having a distribution of capacitors in the lowest process metals of the stack (e.g., the M1 layer 50) and in the N-well to P type junction (e.g., the N-wells 140, 150 to the handle wafer 160), parasitic inductances can be reduced thanks to the minimized distance between gate and capacitors. In other words, a distribution of capacitors in empty space of the transistor circuit structure 10 may be provided to reduce parasitic inductance and area size. In a non-limiting example, known circuits where a capacitor is placed on a transistor side to AC ground the gate, have an inductance $L_p$ value greater than 4 pH (in comparison to less than 1 picohenry (pH) for the present disclosure) and an area penalty of at least 10×10 um² in comparison to the present disclosure for millimeter-wave frequency of operation.

Figure 2A:
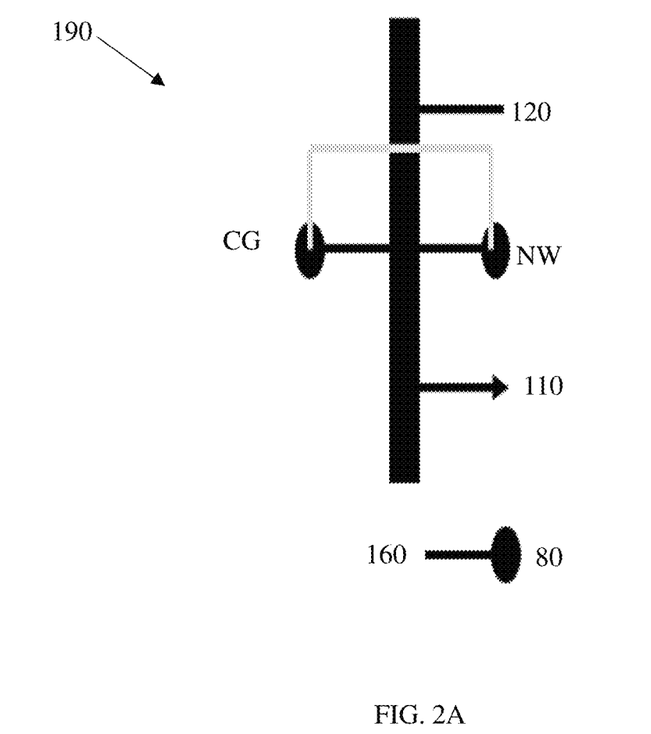
FIGS. 2A-2D show connections across different metal layers in the case of a transistor circuit structure in accordance with aspects of the present disclosure.

FIGS. 2A-2D show connections across different metal layers in the transistor circuit structure in accordance with aspects of the present disclosure. In a non-limiting example, the transistor circuit structure may include sixteen transistor devices connected in parallel. FIG. 2A is a circuit schematic 190 which shows that a transistor gate terminal CG may be connected to the back gate N-well terminal NW such that CG is shorted to AC ground by the parasitic junction capacitance between the NW and the substrate 160 sitting at AC ground. FIG. 2A also shows that the handle wafer 160 is represented by the wafer substrate contact 80 (e.g., the doped region 80) in FIGS. 2B-2D.

Figure 2B:
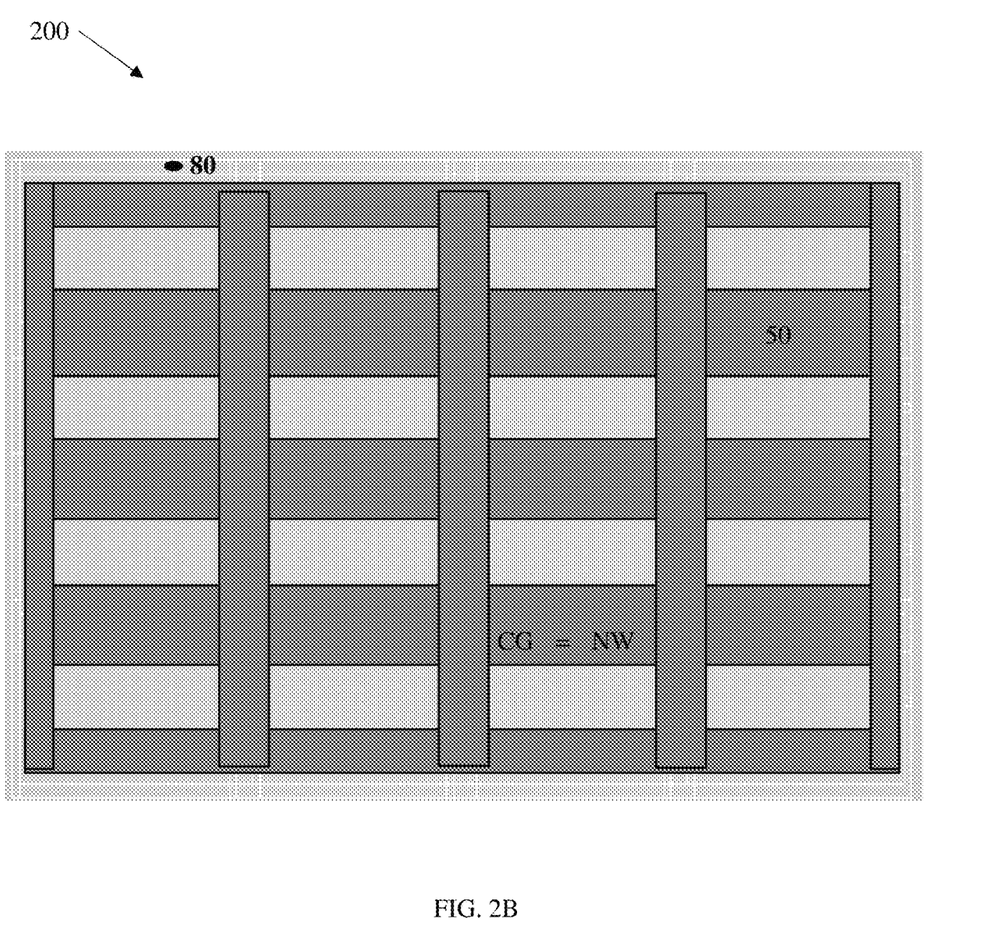

FIG. 2B shows a layout view 200 of the M1 layer 50. In the layout view 200, the transistor gate terminal CG may be connected to the back gate N-well terminal NW (i.e., CG=NW). The transistor gate terminal CG may be distributed across the M1 layer 50. In FIG. 2B, the wafer substrate contact 80 is connected to AC ground.

Figure 2C:
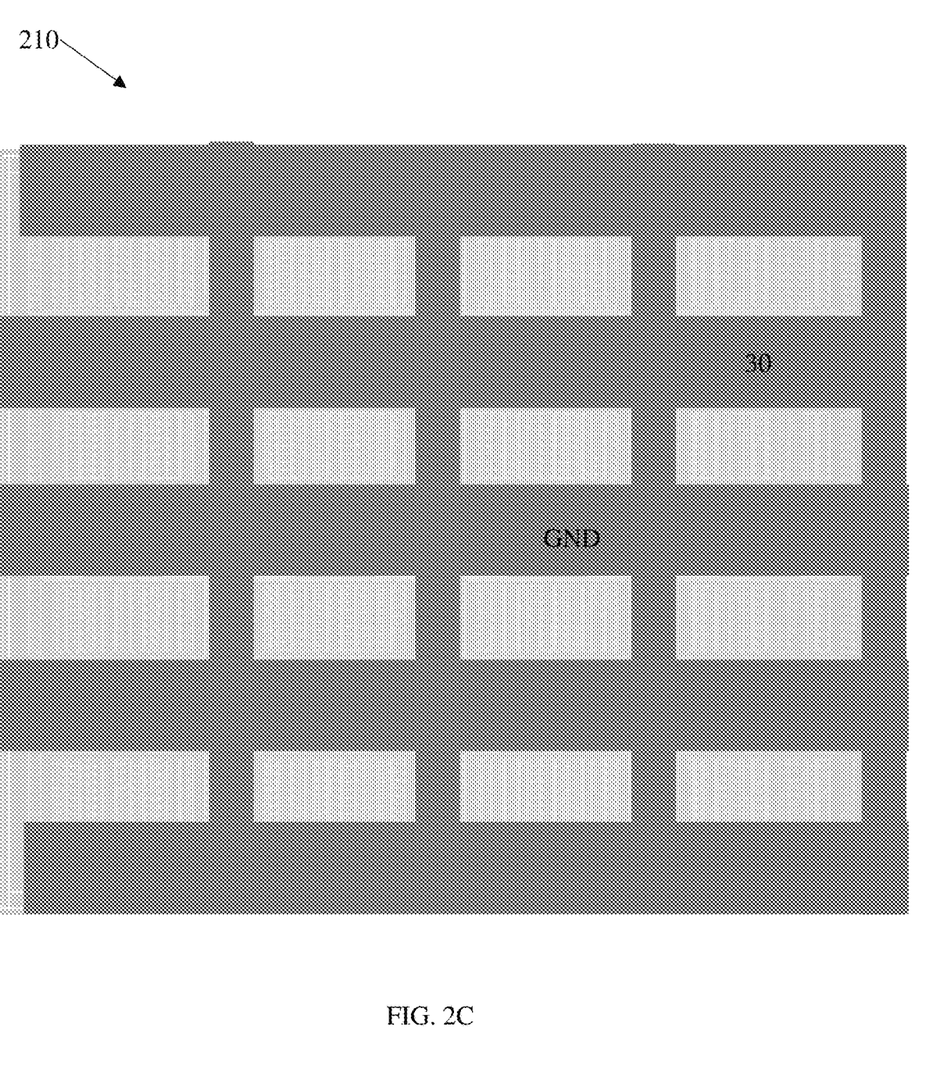

FIG. 2C shows a layout view 210 of the M2 layer 30. In the layout view 210, a second level of metallization (i.e., the M2 layer 30) realizes a ground plane (i.e., AC ground, as represented by the gray shading) which may be overlapped with the metal plane in the M1 layer 50 which supports the transistor gate terminal CG.

Figure 2D:
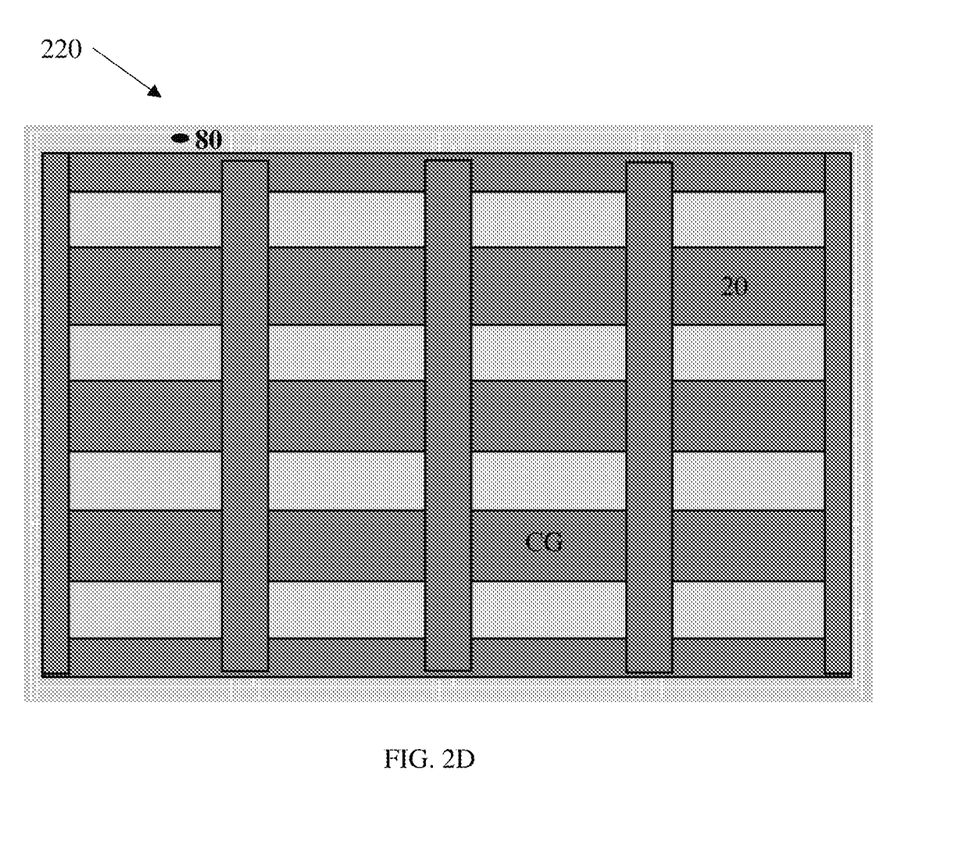

FIG. 2D shows a layout view 220 of the M3 layer 20. In the layout view 220, a third level of metallization (i.e., the M3 layer 20) has been connected to the transistor gate terminal CG with vias, and overlapped with the M2 layer 30, and which supports the ground AC ground, to further increase the capacitance between the transistor gate terminal CG and the AC ground.

In FIGS. 1A-2D, by connecting the gate terminal CG to the N-well terminal NW, approximately 30 femtofarad (fF) of capacitance between CG and AC ground may be added per transistor with width of 19 um thanks to the junction capacitance between the well where the transistor is implemented and the AC-grounded substrate where the well is embedded. The structure in FIGS. 2B-D is formed by 16 transistors organized in 3 rows of 4 transistors each. Further, due to the overlap of the metal planes (i.e., the M1 layer 50, the M2 layer 30, and the M3 layer 20) in the first, second, and third level of metallization, approximately 90 fF may be added per transistor. In a non-limiting example, the capacitance between a gate of each of the transistors is shorted to the well and the handle wafer 160 may be approximately 30 fF. Also, in a non-limiting example, an overlap capacitance between the gate terminal CG in the M1 layer 50 and the ground GND realized in the M2 layer 30 may be approximately 50 fF with a relative dielectric constant of 4,100 μm², and 0.075 μm separation distance. Further, in comparison to known circuits, the present disclosure increases a maximum oscillation frequency by approximately 11.8%, increases a gain by approximately 1 decibel (dB), increases a peak power added efficiency (PAE) by approximately 1%, and increases an output power by 0.5 dB for millimeter-wave frequency of operation when compared to approaches where a capacitor placed on a transistor side is used to AC ground the transistor gate. Thus, in the present disclosure, by minimizing the gate-capacitors interconnection length, this in turn, minimizes the parasitic inductance issues and associated performance losses.

Figure 3A:
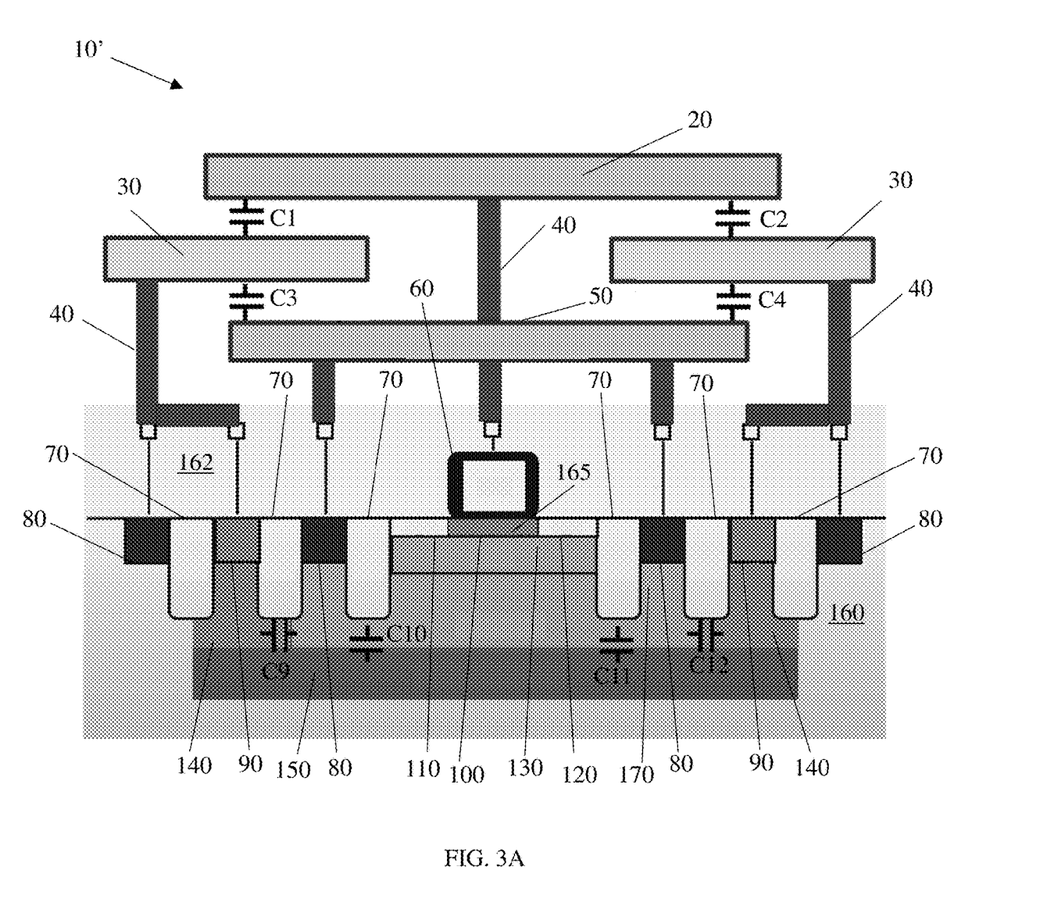
FIGS. 3A-3B show a P-type transistor circuit structure in accordance with additional aspects of the present disclosure.
Figure 3B:
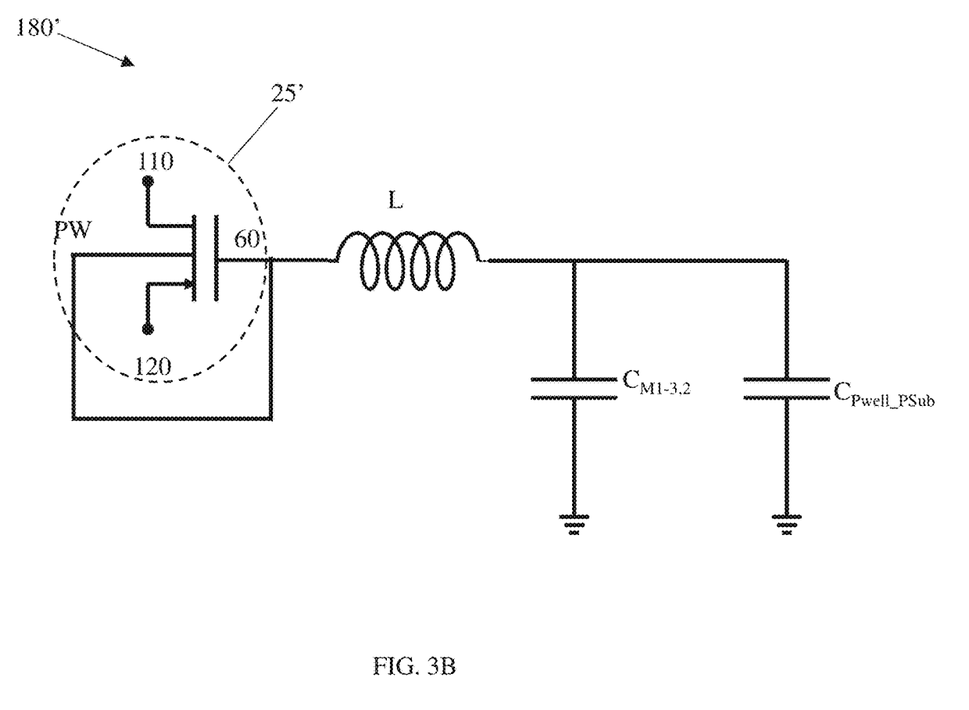

FIGS. 3A-3B show a P-type transistor circuit structure in accordance with aspects of the present disclosure for the case of transistor device implemented in a triple-well technology. The additional aspects of the present disclosure apply also to an N-type device by adjusting polarity of semiconductor materials. In FIG. 3A, the transistor circuit structure 10' is similar to the transistor circuit structure 10 of FIG. 1A. In this layout, through, a P-well 170 is provided between the N-wells 140, the M1 layer 50 may be connected to the P+ regions 80, and the M2 layer 30 may be connected to two diffusion regions (i.e., the P+ regions 80 and the N+ regions 90). Also, the transistor circuit structure 10' includes a capacitance, e.g., as represented by capacitors C9, C10, C11, and C12 for AC grounding the transistor gate while reducing parasitic inductance and silicon area. In embodiments, the capacitors C9 and C12 are generated by the junction capacitance between the N-well 140 and the P-well 170. Also, the capacitance C10 and C11 may be between the P-well 170 and the doped N-Well 150.

FIG. 3B shows a circuit schematic 180' of the transistor circuit structure 10' of FIG. 3A. In the circuit schematic 180', a transistor 25' includes the gate structure 60, the drain 120, the source 110, and a back gate P-well terminal PW. The inductor L represents the parasitic inductance of the interconnection between the gate 60 and the capacitors $C_{M1\text{-}3,2}$ and $C_{Pwell\_Psub}$. The approximated capacitor $C_{M1\text{-}3,2}$ represents the accumulated capacitance of C1, C2, C3, and C4 (e.g., the capacitance between the M1 layer 50, the M2 layer 30, and the M3 layer 20 in FIG. 3A). The approximated capacitance $C_{Pwell\_Psub}$ represents the accumulated capacitance of C9, C10, C11, and C12 (e.g., the capacitance at a junction between the N-wells 140, 150 and the P-well 170). The transistor circuit structure 10' and the circuit schematic 180' have similar advantages as the transistor circuit structure 10 and the circuit schematic 180 of FIGS. 1A-1B. In other words, the transistor circuit structure 10' and the circuit schematic 180' minimizes the parasitic inductance $L_p$ due to a minimized distance between the transistor gate and the capacitors $C_{M1\text{-}3,2}$ and $C_{Pwell\_Psub}$ and saves silicon area as the capacitor required to AC ground to transistor gate is realized in the same area of the transistor device.

The common-gate amplifier circuit may be utilized in system on chip (SoC) technology. The SoC is an integrated circuit (also known as a "chip") that integrates all components of an electronic system on a single chip or substrate. As the components are integrated on a single substrate, SoCs consume much less power and take up much less area than multi-chip designs with equivalent functionality. Because of this, SoCs are becoming the dominant force in the mobile computing (such as in Smartphones) and edge computing markets. SoC is also used in embedded systems and the Internet of Things.

The method(s) as described above is used in the fabrication of integrated circuit chips. The resulting integrated circuit chips may be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either surface interconnections and buried interconnections or both surface interconnections and buried interconnections). In any case the chip is then integrated with other chips, discrete circuit elements, and/or other signal processing devices as part of either (a) an intermediate product, such as a motherboard, or (b) an end product. The end product may be any product that includes integrated circuit chips, ranging from toys and other low-end applications to advanced computer products having a display, a keyboard or other input device, and a central processor.

The descriptions of the various embodiments of the present disclosure have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure comprising:
   at least one well in a substrate;
   a first metal layer connected to a gate of a transistor circuit;
   a second metal layer overlapped over the first metal layer to form a first capacitor;
   a third metal layer connected with vias to the first metal layer and overlapped with the second metal layer to form a second capacitor;
   a shallow trench isolation (STI) which separates a P+ region from an N+ region and separates the P+ region from the transistor circuit; and
   at least one capacitance in at least one of a junction between the at least one well and the substrate and between overlapped metal layers of the first metal layer, the second metal layer, and the third metal layer.

2. The structure of claim 1, wherein the first metal layer and the second metal layer have a minimized inductance of less than one picohenry (pH).

3. The structure of claim 1, wherein the second metal layer is connected to ground.

4. The structure of claim 1, wherein the first metal layer is connected to an N+region over the at least one well.

5. The structure of claim 1, wherein the first metal layer is connected to a P+ region over the at least one well.

6. The structure of claim 1, wherein the first metal layer, the second metal layer, and the third metal layer are vertically stacked above each other and directly over the gate.

7. The structure of claim 1, wherein the first capacitor formed by the second metal layer overlapping the first metal layer comprises a distributed capacitor in a lowest metal layer.

8. The structure of claim 1, wherein the second metal layer is connected to a P+ region connected to the substrate, and the first metal layer is connected to the gate and to an N+ region connected to the at least one well.

9. The structure of claim 1, wherein the second metal layer is connected to an N+ region and a P+ region connected to the substrate, and the first metal layer is connected to the gate and a P+ region connected to the at least one well.

10. The structure of claim 1, wherein the at least one capacitance comprises a capacitance between a P-well and an N-well and a deep N-well and the P-well.

11. The structure of claim 1, wherein the at least one well comprises an N-well within a P-Well, and the at least one capacitance comprises a capacitance that occurs at different locations of the junction between a deep N-well and the P-well and the N-Well and the P-well.

12. The structure of claim 1, wherein the at least one well comprises a P-well within an N-well, and the at least one capacitance comprises a capacitance that occurs at different locations of the junction between a deep N-well and the P-well and the N-Well and the P-well.

13. A circuit comprising:
   a transistor comprising a gate over at least one N-well in a substrate,
   a first metal layer connected to the gate;
   a second metal layer overlapped over the first metal layer to form a first capacitor;
   a third metal layer connected to the first metal layer through vias and overlapped with the second metal layer to form a second capacitor;
   a shallow trench isolation (STI) which separates a P+ region from an N+ region and separates the P+ region from the transistor; and
   at least one capacitance at a junction between the at least one N-well and the substrate, wherein the first metal layer, the second metal layer, and the third metal layer are vertically stacked above each other and directly over the gate.

14. The circuit of claim 13, wherein the second metal layer is connected to AC ground.

15. The circuit of claim 13, wherein the first metal layer is connected to an N+ region over the at least one N-well.

16. The circuit of claim 13, wherein the first metal layer is connected to a P+ region over the at least one N-well.

17. The circuit of claim 13, wherein the first capacitor formed by the second metal layer overlapping the first metal layer comprises a distributed capacitor on a lowest metal layer.

18. A method comprising:
forming at least one well in a substrate;
forming a transistor circuit on the at least one well;
forming a first metal layer over a gate of the transistor circuit;
forming a second metal layer over the first metal layer; and
forming a third metal layer over the second metal layer,
wherein the second metal layer is connected to the substrate through a via, the third metal layer is connected to the first metal layer through a second via, and at least one capacitance in at least one of a junction between the at least one well and the substrate and between overlapped metal layers of the first metal layer, the second metal layer, and the third metal layer.

* * * * *